United States Patent
Wang et al.

(10) Patent No.: US 12,096,706 B2
(45) Date of Patent: *Sep. 17, 2024

(54) RESISTIVE RANDOM ACCESS MEMORY DEVICE

(71) Applicant: Taiwan Semiconductor Manufacturing Co., Ltd., Hsinchu (TW)

(72) Inventors: Huei-Tsz Wang, Hsinchu (TW); Po-Shu Wang, Hsinchu (TW); Wei-Ming Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/232,750

(22) Filed: Aug. 10, 2023

(65) Prior Publication Data
US 2023/0397512 A1 Dec. 7, 2023

Related U.S. Application Data

(60) Continuation of application No. 17/881,419, filed on Aug. 4, 2022, now Pat. No. 11,818,970, which is a (Continued)

(51) Int. Cl.
*H10N 70/00* (2023.01)
*H10B 61/00* (2023.01)
(Continued)

(52) U.S. Cl.
CPC .......... *H10N 70/841* (2023.02); *H10B 61/22* (2023.02); *H10B 63/30* (2023.02); *H10N 50/85* (2023.02);
(Continued)

(58) Field of Classification Search
CPC .... H10N 70/841; H10N 50/85; H10N 70/011; H10N 70/063; H10N 70/20; H10N 70/24;
(Continued)

(56) References Cited

U.S. PATENT DOCUMENTS 7,638,859 B2 12/2009 Lu et al.
9,461,245 B1 10/2016 Yang et al.
(Continued)

FOREIGN PATENT DOCUMENTS

CN 1881558 A 12/2006
CN 104934411 A 9/2015
(Continued)

OTHER PUBLICATIONS

Official Action issued Nov. 23, 2018, in corresponding Taiwan Application No. 10721082100; machine translation provided.

*Primary Examiner* — Patricia D Valenzuela
(74) *Attorney, Agent, or Firm* — Duane Morris LLP

(57) ABSTRACT

A memory cell includes: a first contact feature partially embedded in a first dielectric layer; a barrier layer, lining the first contact feature, that comprises a first portion disposed between the first contact feature and first dielectric layer, and a second portion disposed above the first dielectric layer; a resistive material layer disposed above the first contact feature, the resistive material layer coupled to the first contact feature through the second portion of the barrier layer; and a second contact feature embedded in a second dielectric layer above the first dielectric layer.

20 Claims, 17 Drawing Sheets

Related U.S. Application Data continuation of application No. 17/140,495, filed on Jan. 4, 2021, now Pat. No. 11,430,953, which is a division of application No. 15/908,601, filed on Feb. 28, 2018, now Pat. No. 10,886,465.

(51) Int. Cl.

| | | |
|---|---|---|
| *H10B 63/00* | (2023.01) | |
| *H10N 50/85* | (2023.01) | |
| *H10N 70/20* | (2023.01) | |
| *H01L 23/528* | (2006.01) | |
| *H01L 23/532* | (2006.01) | |
| *H01L 23/544* | (2006.01) | |
| *H10N 50/80* | (2023.01) | |

(52) U.S. Cl.
CPC ......... *H10N 70/011* (2023.02); *H10N 70/063* (2023.02); *H10N 70/20* (2023.02); *H10N 70/24* (2023.02); *H10N 70/245* (2023.02); *H10N 70/826* (2023.02); *H10N 70/881* (2023.02); *H10N 70/8825* (2023.02); *H10N 70/8833* (2023.02); *H10N 70/8836* (2023.02); *H01L 23/528* (2013.01); *H01L 23/53238* (2013.01); *H01L 23/544* (2013.01); *H01L 2223/54426* (2013.01); *H10B 63/80* (2023.02); *H10B 63/84* (2023.02); *H10N 50/80* (2023.02); *H10N 70/021* (2023.02)

(58) Field of Classification Search
CPC .. H10N 70/245; H10N 70/826; H10N 70/881; H10N 70/8825; H10N 70/8833; H10N 70/8836; H10N 50/80; H10N 70/021; H10B 61/22; H10B 63/30; H10B 63/80; H10B 63/84; H01L 23/528; H01L 23/53238; H01L 23/5283; H01L 23/53266; H01L 2223/54426; H01L 23/544

See application file for complete search history.

(56) References Cited

U.S. PATENT DOCUMENTS

| | | |
|---|---|---|
| 10,109,793 B2 | 10/2018 | Yang et al. |
| 10,886,465 B2 | 1/2021 | Wang et al. |
| 11,430,953 B2 * | 8/2022 | Wang ................. H10N 70/8825 |
| 2009/0230378 A1 | 9/2009 | Ryoo et al. |
| 2014/0056056 A1 | 2/2014 | Takagi et al. |
| 2017/0141159 A1 | 5/2017 | Kim |
| 2017/0162784 A1 | 6/2017 | Banno et al. |
| 2017/0186748 A1 | 6/2017 | Lee et al. |
| 2018/0233661 A1 | 8/2018 | Lin et al. |
| 2018/0337182 A1 | 11/2018 | Lee et al. |
| 2019/0229264 A1 | 7/2019 | Karpov et al. |

FOREIGN PATENT DOCUMENTS

| | | |
|---|---|---|
| CN | 107039585 A | 8/2017 |
| TW | 201735154 A | 10/2017 |

\* cited by examiner

RESISTIVE RANDOM ACCESS MEMORY DEVICE

RELATED APPLICATION

This application is a continuation of U.S. patent application Ser. No. 17/881,419, filed Aug. 4, 2022, which is a continuation of U.S. patent application Ser. No. 17/140,495, filed Jan. 4, 2021, now U.S. Pat. No. 11,430,953, which is a divisional application of U.S. patent application Ser. No. 15/908,601 filed Feb. 28, 2018, now U.S. Pat. No. 10,886,465, the entireties of each are incorporated by reference herein.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state (HRS) and a low resistance state (LRS), have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

In general, an RRAM device includes a lower electrode (e.g., an anode) and an upper electrode (e.g., a cathode) with a variable resistive material layer interposed therebetween. To operate the RRAM device, electrical signals (e.g., voltage signals) are typically applied on a respective contact feature, through the upper/lower electrode, to the variable resistive material layer so as to cause the variable resistive material layer to transition between the HRS and LRS. Accordingly, the morphological characteristic of an interface formed between the upper/lower electrode and contact feature may effectively determine performance of the RRAM device. In existing RRAM device, defects at such an interface (e.g., loss of conductive materials at corners of the contact feature) are typically present, which may be due to one or more misalignments, prior to, simultaneously with or subsequently to, the formation of the lower electrode, for example.

Thus, existing RRAM devices and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
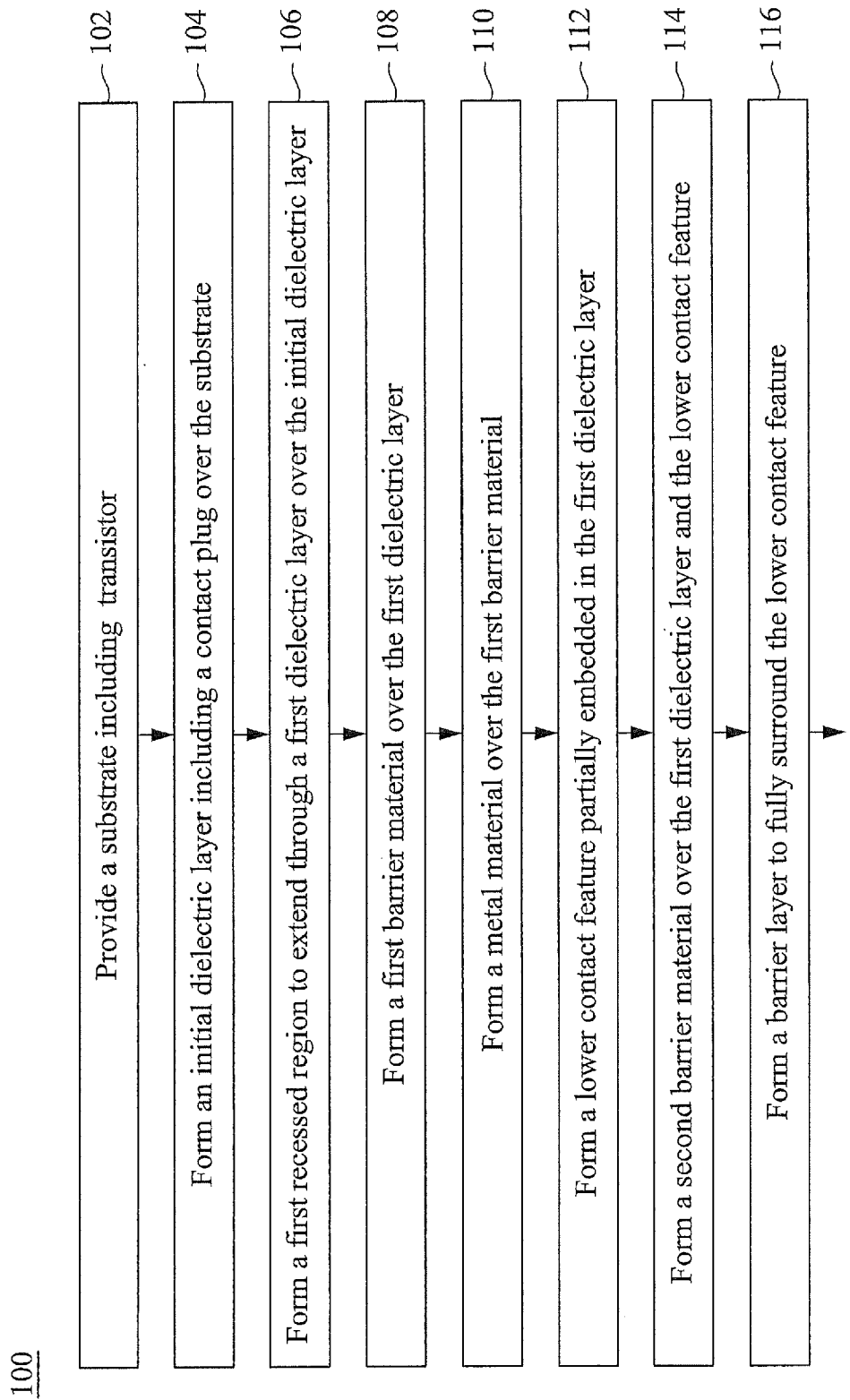
FIGS. 1A and 1B illustrate a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel resistive random access memory (RRAM) device and methods to form the same. In some embodiments, the disclosed RRAM device includes an RRAM resistor with a variable resistive material layer sandwiched between a lower contact feature and an upper contact feature, wherein at least one of the lower and upper contact features is fully protected (e.g., surrounded) by a barrier layer. In some embodiments, the barrier layer is formed to surround the lower contact feature prior to forming the variable resistive material layer. As such, such a disclosed barrier layer may provide protection to the lower contact feature when one or more patterning processes (e.g., etching processes) are performed to form a recessed region over the lower contact feature, which is typically known as a "bottom electrode via (BEVA)," even in the presence of a misalignment of the one or more patterning processes. Accordingly, the issues identified in the existing RRAM devices may be advantageously eliminated in the disclosed RRAM device.

Figure 1B:
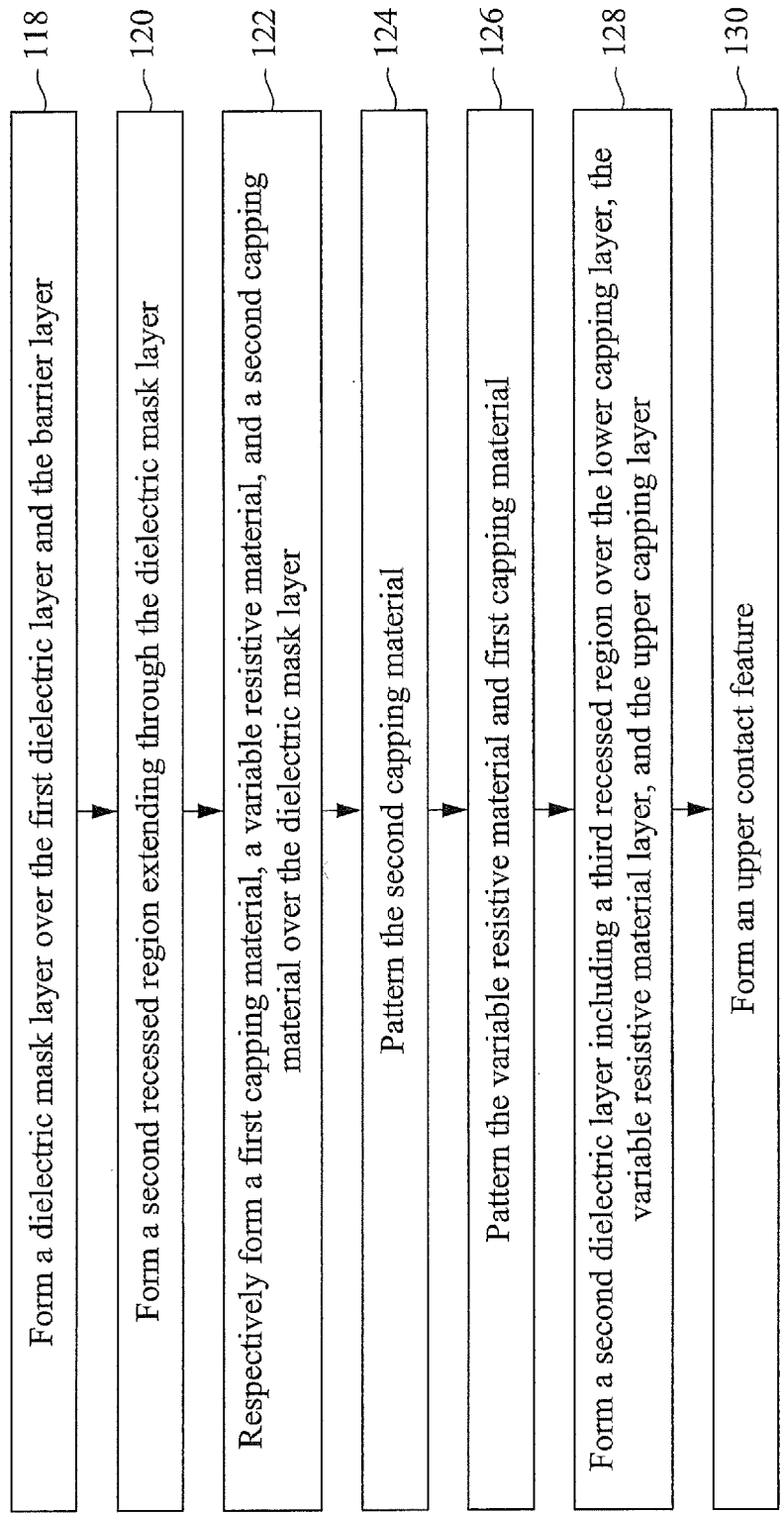

FIGS. 1A and 1B illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, an RRAM device. As employed by the present disclosure, the RRAM device refers to any device including a variable resistive material layer. It is noted that the method 100 of FIGS. 1A and 1B does not produce a completed RRAM device. A completed RRAM device may be fabricated using complementary metal-oxide-semiconductor (CMOS) technology processing. Accordingly, it is understood that additional operations may be provided before, during, and after the method 100 of FIGS. 1A and 1B, and that some other operations may only be briefly described herein. In some other embodiments, the method may be used to form any of a variety of nonvolatile memory (NVM) devices, such as ferroelectric random access memory (FRAM) devices, phase-change random access memory (PRAM) devices, magnetoresistive random access memory (MRAM) devices, etc., while remaining within the scope of the present disclosure.

Referring first to FIG. 1A, in some embodiments, the method 100 starts with operation 102 in which a substrate including a transistor is provided. The method 100 continues to operation 104 in which an initial dielectric layer including a contact plug is formed over the substrate. In some embodiments, the initial dielectric layer is formed over the transistor, and the contact plug extends through the initial dielectric layer and is coupled to at least one of conductive feature (e.g., a drain, a source, a gate, etc.) of the transistor. The method 100 continues to operation 106 in which a first recessed region is formed to extend through a first dielectric layer over the initial dielectric layer. The method 100 continues to operation 108 in which a first barrier material is formed over the first dielectric layer. In some embodiments, the first barrier material overlays an upper boundary of the first dielectric layer and lines the first recessed region, which will be discussed below. The method 100 continues to operation 110 in which a metal material is formed over the first barrier material. In some embodiments, the metal material is formed to refill the first recessed region and overlay the upper boundary of the first dielectric layer with the first barrier material coupled between the metal material and the first dielectric layer.

The method 100 continues to operation 112 in which a lower contact feature partially embedded in the first dielectric layer is formed. In some embodiments, the lower contact feature is formed by polishing excessive metal material and first barrier material until an upper boundary of the lower contact feature is exposed. Accordingly, respective upper boundaries of sidewall portions of the first barrier material and the upper boundary of the first dielectric layer may be exposed and re-exposed, respectively. In some embodiments, the lower contact feature is partially embedded in the first dielectric layer with its sidewalls and lower boundary lined by respective portions of the first barrier material. In some embodiments, the lower contact feature is electrically coupled to the contact plug through the first barrier material. The method 100 continues to operation 114 in which a second barrier material is formed over the first dielectric layer and the lower contact feature. In some embodiments, the first and second barrier materials are formed of a same material such as, for example, tantalum nitride and/or tantalum, which will be discussed in further detail below. The method 100 continues to operation 116 in which a barrier layer is formed to fully surround the lower contact feature. In some embodiments, the barrier layer is formed by the respective portions of the first barrier material lining the sidewalls and lower boundary of the lower contact feature, and a remaining portion of the second barrier material extending along the upper boundary of the lower contact feature, which will be discussed in further detail below.

Referring then to FIG. 1B, the method 100 continues to operation 118 in which a dielectric mask layer is formed over the first dielectric layer and the barrier layer. The method 100 continues to operation 120 in which a second recessed region extending through the dielectric mask layer is formed. In some embodiments, the second recessed region re-exposes the above-mentioned remaining portion of the second barrier material, i.e., an upper boundary of the barrier layer. The method 100 continues to operation 122 in which a first capping material, a variable resistive material, and a second capping material are respectively formed over the dielectric mask layer. In some embodiments, the first capping material may overlay the dielectric mask layer to refill the second recessed region to produce a respective upper boundary, the variable resistive material may overlay the upper boundary of the first capping material to produce a respective planar upper boundary, and the second capping material may overlay the upper boundary of the variable resistive material to produce a respective upper boundary. It is noted that each of the respective upper boundaries may not necessarily form a planar surface.

The method 100 continues to operation 124 in which the second capping material is patterned. In some embodiment, the patterned second capping material may form an upper capping layer, which may serve as a part of an etching mask. The method 100 continues to operation 126 in which the variable resistive material and the first capping material are patterned. In some embodiments, the variable resistive material and the first capping material may be, respectively or collectively, patterned (e.g., etched) using the upper capping layer and spacers as the etching mask. Accordingly, a variable resistive material layer and a lower capping layer may be respectively formed by the patterned variable resistive material and first capping material. The method 100 continues to operation 128 in which a second dielectric layer including a third recessed region is formed over the lower capping layer, the variable resistive material layer, and the upper capping layer. In some embodiments, the third recessed region is formed to expose at least a portion of an upper boundary of the upper capping layer. The method 100 continues to operation 130 in which an upper contact feature is formed. In some embodiments, at least a portion of the upper contact feature is formed in the third recessed region. In some embodiments, similar as the lower contact feature, the upper contact feature may also be fully surrounded by a respective barrier layer.

Figure 2A:
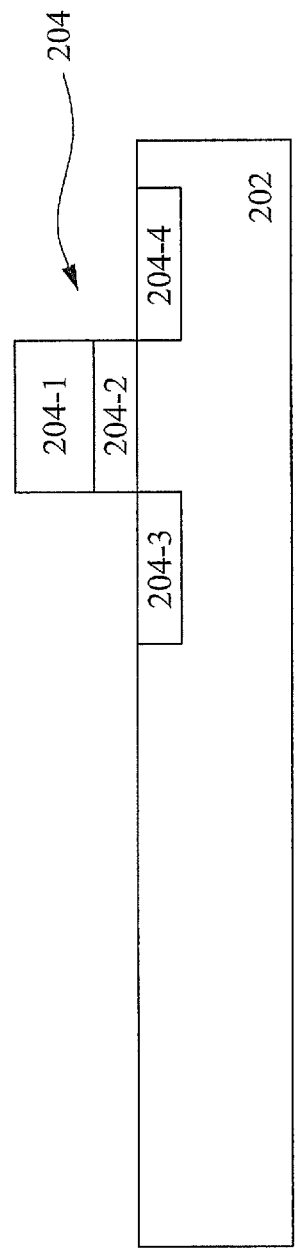
FIGS. 2A, 2B, 2C, 2D, 2E, 2F, 2G, 2H, 2I, 2J, 2K, 2L, 2M, 2N, and 2O illustrate cross-sectional views of an exemplary semiconductor device during various fabrication stages, made by the method of FIG. 1, in accordance with some embodiments.

In some embodiments, operations of the method 100 may be associated with cross-sectional views of a semiconductor device 200 at various fabrication stages as shown in FIGS. 2A, 2B, 2C, 2D, 2E, 2F, 2G, 2H, 2I, 2J, 2K, 2L, 2M, 2N and 2O, respectively. In some embodiments, the semiconductor device 200 may be an RRAM device. The RRAM device 200 may be included in a microprocessor, memory cell, and/or other integrated circuit (IC). Also, FIGS. 2A through 2O are simplified for a better understanding of the concepts of the present disclosure. For example, although the figures illustrate the RRAM device 200, it is understood the IC, in which the RRAM device 200 is formed, may include a number of other devices comprising resistors, capacitors, inductors, fuses, etc., which are not shown in FIGS. 2A through 2O, for purposes of clarity of illustration.

Corresponding to operation 102 of FIG. 1A, FIG. 2A is a cross-sectional view of the RRAM device 200 including a substrate 202 with a transistor 204, which is provided at one of the various stages of fabrication, according to some embodiments. Although the RRAM device 200 in the illustrated embodiment of FIG. 2A includes only one transistor 204, it is understood that the illustrated embodiment of FIG. 2A and the following figures are merely provided for illustration purposes. Thus, the RRAM device 200 may include any desired number of transistors while remaining within the scope of the present disclosure.

In some embodiments, the substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the transistor 204 includes a gate electrode 204-1, a gate dielectric layer 204-2, and source/drain features 204-3 and 204-4. The source/drain features 204-3 and 204-4 may be formed using doping processes such as ion implantation. The gate dielectric layer 204-2 may include a dielectric material such as, silicon oxide, silicon nitride, silicon oxinitride, dielectric with a high dielectric constant (high k), and/or combinations thereof, which may be formed using deposition processes such as atomic layer deposition (ALD). The gate electrode 204-1 may include a conductive material, such as polysilicon or a metal, which may be formed using deposition processes such as chemical vapor deposition (CVD). As will be discussed in further detail below, the transistor 204 may serve as an access transistor of the RRAM device 200, which controls an access to a data storage component (e.g., an RRAM resistor) of the RRAM device 200 during read/write operations.

Figure 2B:
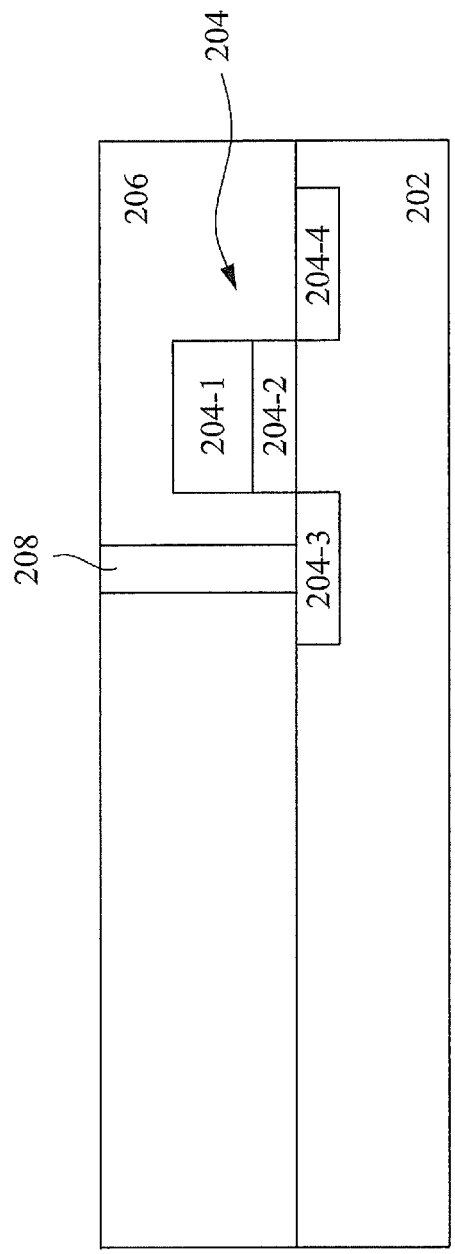

Corresponding to operation 104 of FIG. 1A, FIG. 2B is a cross-sectional view of the RRAM device 200 including an initial dielectric layer 206 with a contact plug 208, which is formed at one of the various stages of fabrication, according to some embodiments. As shown, the initial dielectric layer 206 is formed over the transistor 204, and the contact plug 208 is formed to extend through the initial dielectric layer 206. In some embodiments, the contact plug 208 is coupled to at least one of the conductive features of the transistor 204. In the illustrated embodiment of FIG. 2B, the contact plug 208 is coupled to the source/drain feature 204-3.

In some embodiments, the initial dielectric layer 206 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the contact plug 208 is formed of a conductive material such as, for example, copper (Cu), aluminum (Al), tungsten (W), etc.

The contact plug 208 may be formed by at least some of the following process steps: using chemical vapor deposition (CVD), physical vapor deposition (PVD), spin-on coating, and/or other suitable techniques to deposit the above-described dielectric material of the initial dielectric layer 206 over the substrate 202 and the transistor 204; performing one or more patterning processes (e.g., a lithography process, a dry/wet etching process, a cleaning process, a soft/hard baking process, etc.) to form an opening through the dielectric material; using CVD, PVD, E-gun, and/or other suitable techniques to deposit the above-described conductive material to refill the opening; and polishing out excessive conductive material to form the contact plug 208.

Figure 2C:
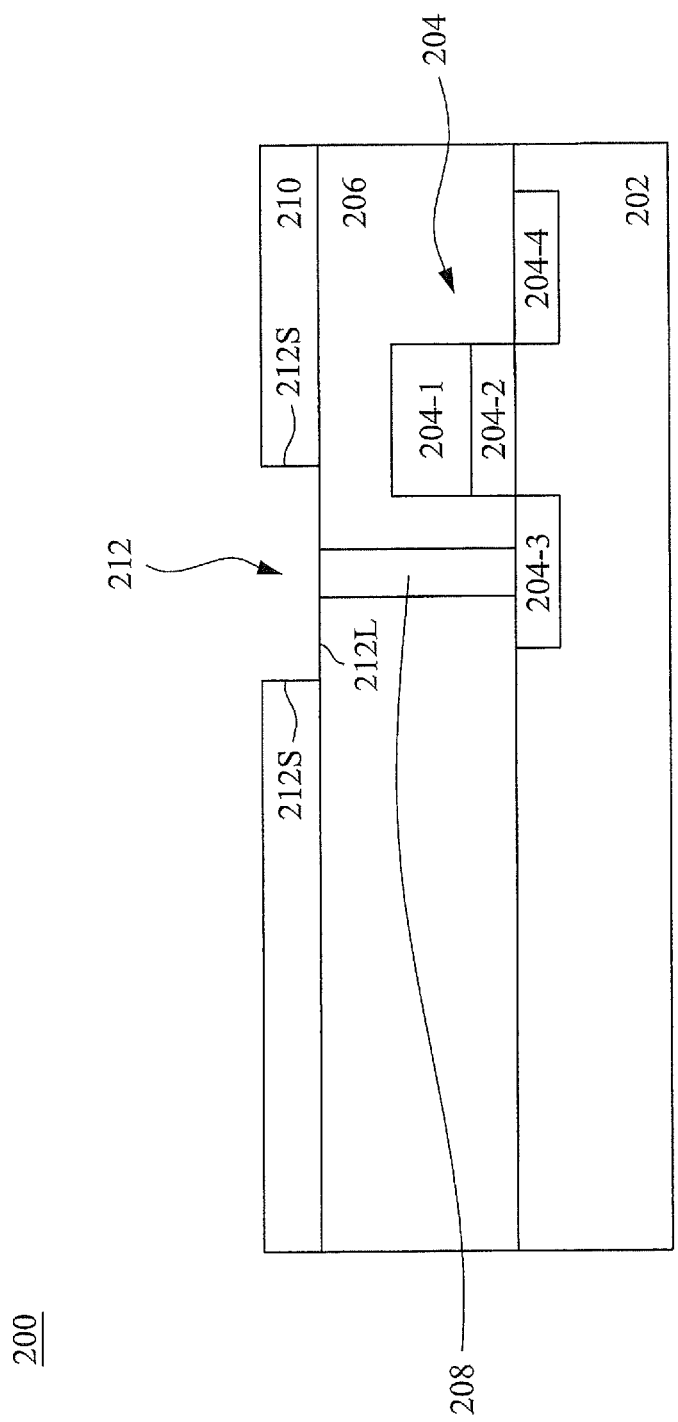

Corresponding to operation 106 of FIG. 1A, FIG. 2C is a cross-sectional view of the RRAM device 200 including a first dielectric layer 210 with a recessed region 212, which is formed at one of the various stages of fabrication, according to some embodiments. As shown, the recessed region 212 vertically extends through the first dielectric layer 210 thereby exposing the contact plug 208, and horizontally extends along the first dielectric layer 210 thereby exposing a portion of an upper boundary of the initial dielectric layer 206. In particular, upon the formation of the recessed region 212, respective lower boundary 212L and sidewalls 212S of the recessed region 212 are exposed.

In some embodiments, the first dielectric layer 210 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the recessed region 212 may be formed by performing at least some of the following processes: forming an optional anti-reflective coating (ARC) layer over a dummy first dielectric layer (i.e., the first dielectric layer 210 prior to forming the recessed region 212); forming a patternable layer (e.g., a photoresist layer) with an opening that is aligned with the contact plug 208; while using the patternable layer as a mask, performing one or more dry etching processes to remove the portion of the dummy first dielectric layer that are not covered by the patternable layer; and removing the patternable layer.

Figure 2D:
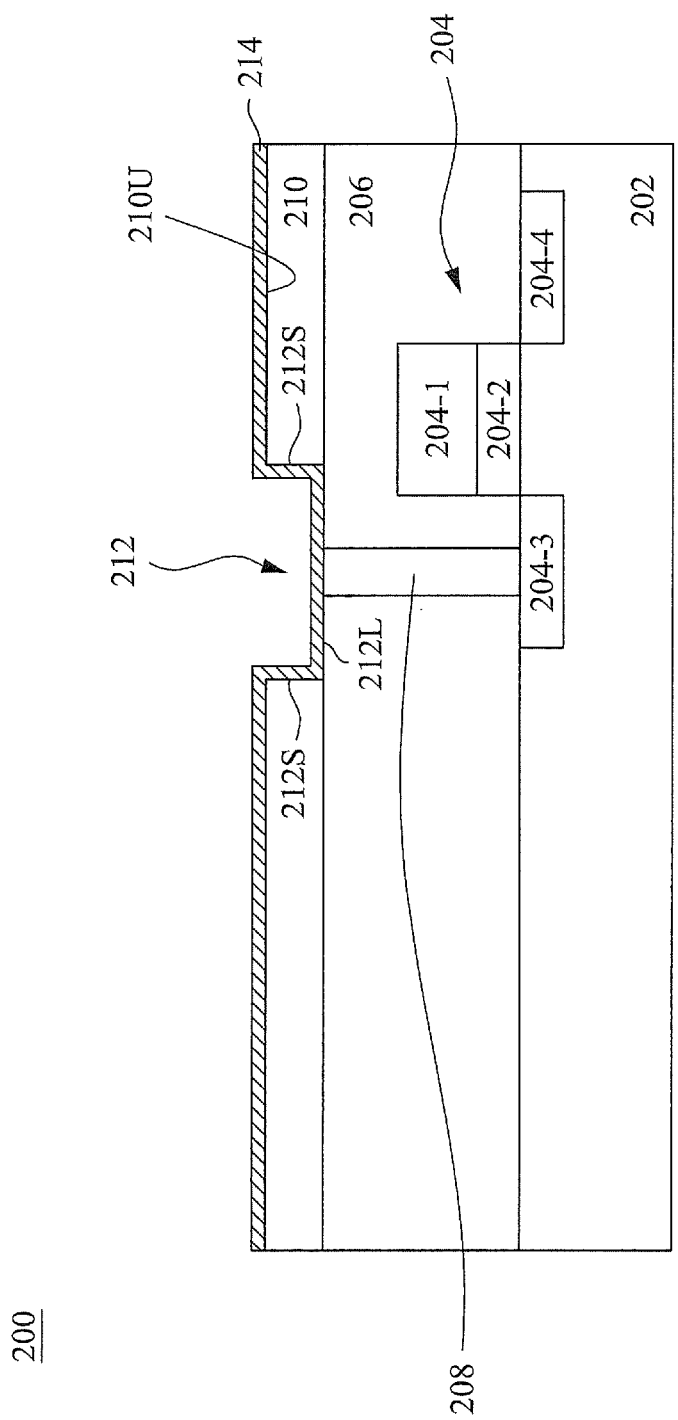

Corresponding to operation 108 of FIG. 1A, FIG. 2D is a cross-sectional view of the RRAM device 200 including a first barrier material 214, which is formed at one of the various stages of fabrication, according to some embodiments. In some embodiments, the first barrier material 214 is substantially conformal and thin, such that the first barrier material 214 can overlay an upper boundary 210U of the first dielectric layer 210, and further line the recessed region 212 (i.e., extending along the sidewalls 212S and lower boundary 212L).

In some embodiments, the first barrier material 214 may include a material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or suicide of these, such as TaN, TiN, TiAlN, TiW, or a combination thereof. Although the first barrier material 214 is shown as a single layer in the illustrated embodiment of FIG. 2D (and the following figures), it is noted that the first barrier material 214 may include plural layers formed as a stack, wherein each of the plural layers is formed of one of the above-described materials, e.g., TaN, Ta, Ta+TaN, etc. In some embodiments, the first barrier material 214 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the first dielectric layer 210.

Figure 2E:
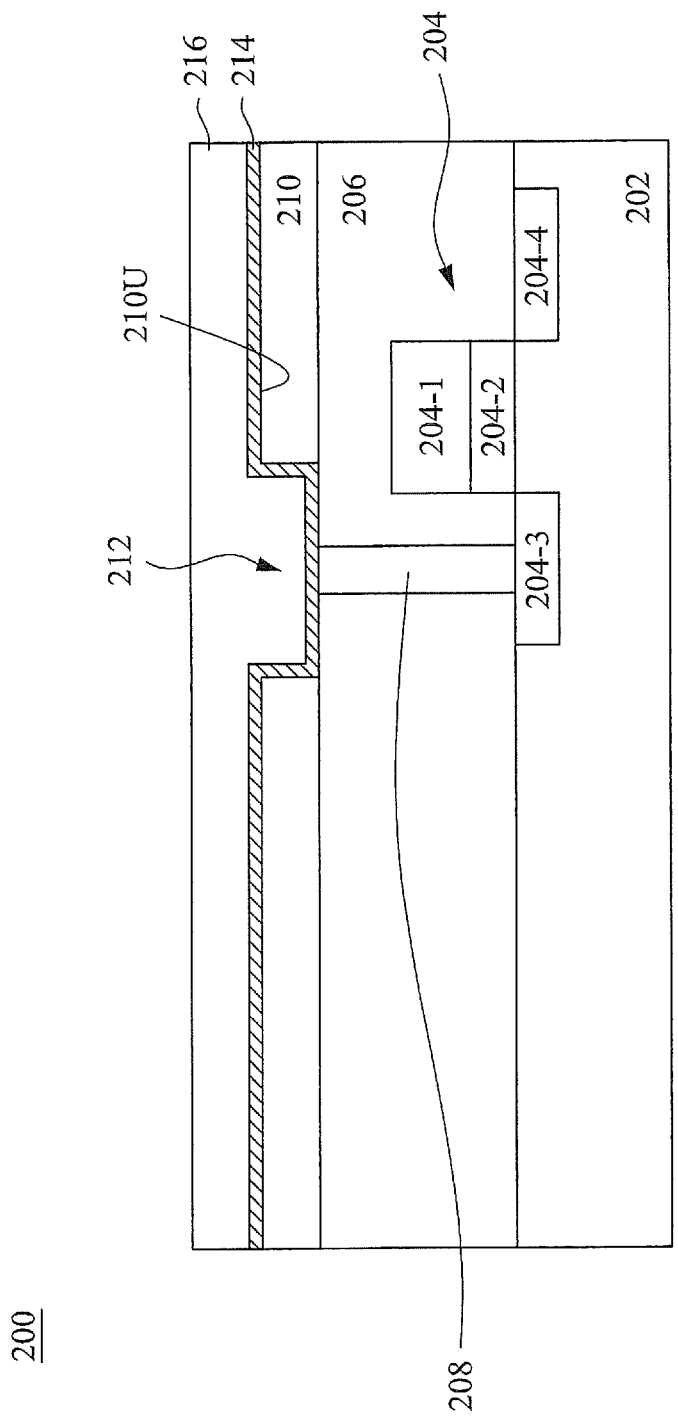

Corresponding to operation 110 of FIG. 1A, FIG. 2E is a cross-sectional view of the RRAM device 200 including a metal material 216, which is formed at one of the various stages of fabrication, according to some embodiments. As shown, the metal material 216 is formed over the first barrier material 214 to refill the recessed region 212, and further overlay the upper boundary 210U of the first dielectric layer 210. In some embodiments, the metal material 216 includes a conductive material such as, for example, copper (Cu), aluminum (Al), tungsten (W), etc. The metal material 216 may be formed by using CVD, PVD, E-gun, and/or other suitable techniques to deposit the above-described conductive material over the first barrier material 214.

Figure 2F:
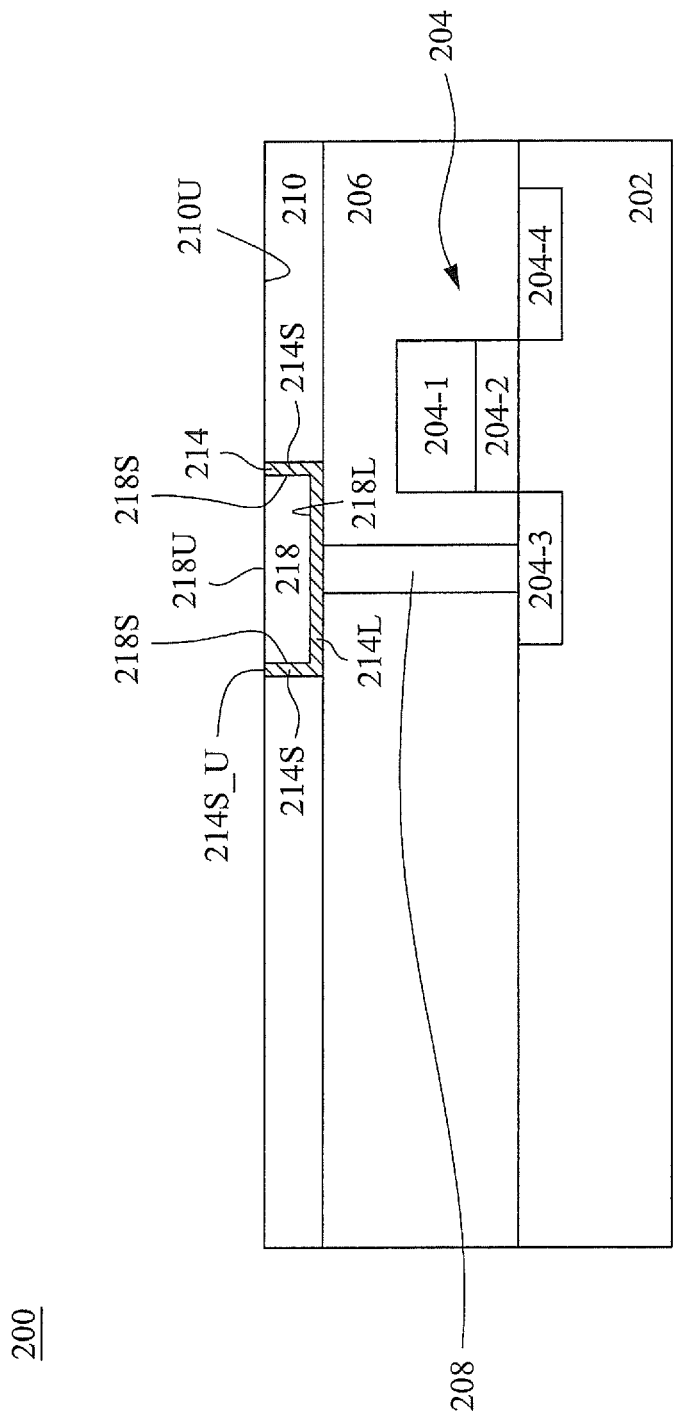

Corresponding to operation 112 of FIG. 1A, FIG. 2F is a cross-sectional view of the RRAM device 200 including a lower contact feature 218, which is formed at one of the various stages of fabrication, according to some embodiments. As shown, the lower contact feature 218 is partially embedded in the first dielectric layer 210. In particular, sidewalls 218S of the lower contact feature 218 are embedded in the first dielectric layer 210 with respective sidewall portions 214S of the first barrier material 214 disposed therebetween; a lower boundary 218L of the lower contact feature 218 is embedded in the first dielectric layer 210 with a lower portion 214L of the first barrier material 214 disposed therebetween; and an upper boundary 218U of the lower contact feature 218 is exposed (i.e., not embedded in the first dielectric layer 210).

In some embodiments, the lower contact feature 218 is formed by performing at least one polishing (e.g., a chemical-mechanical polishing (CMP)) process on the metal material 216 and the first barrier material 214 until the upper boundaries 210U and 218U are respectively re-exposed and exposed, and at least one cleaning process. Further, upon the formation of the lower contact feature 218, respective upper boundaries 214S_U of the sidewall portions 214 are exposed. In some embodiments, the upper boundaries 210U, 214S_U, and 218U may form a coplanar surface.

In some embodiments, the initial dielectric layer 206 with the contact plug 208 extending therethrough is typically referred to as an "initial tier," or "tier 0;" and the first dielectric layer 210 with the lower contact feature 218 extending therethrough is typically referred to as a "first tier," or "tier 1." And the lower contact feature 218 is typically referred to as an interconnection structure configured to electrically couple one conductive feature to another conductive feature. In the example where the lower contact feature 218 is formed of Cu (copper), the lower contact feature 218 may be a Cu interconnection structure. Although in the illustrated embodiments of FIG. 2F (and the following figures), the first tier is directly above the initial tier, it is noted that between the initial tier and the first tier, there may be any desired number of tiers that are each substantially similar to the first tier while remaining within the scope of the present disclosure.

Figure 2G:
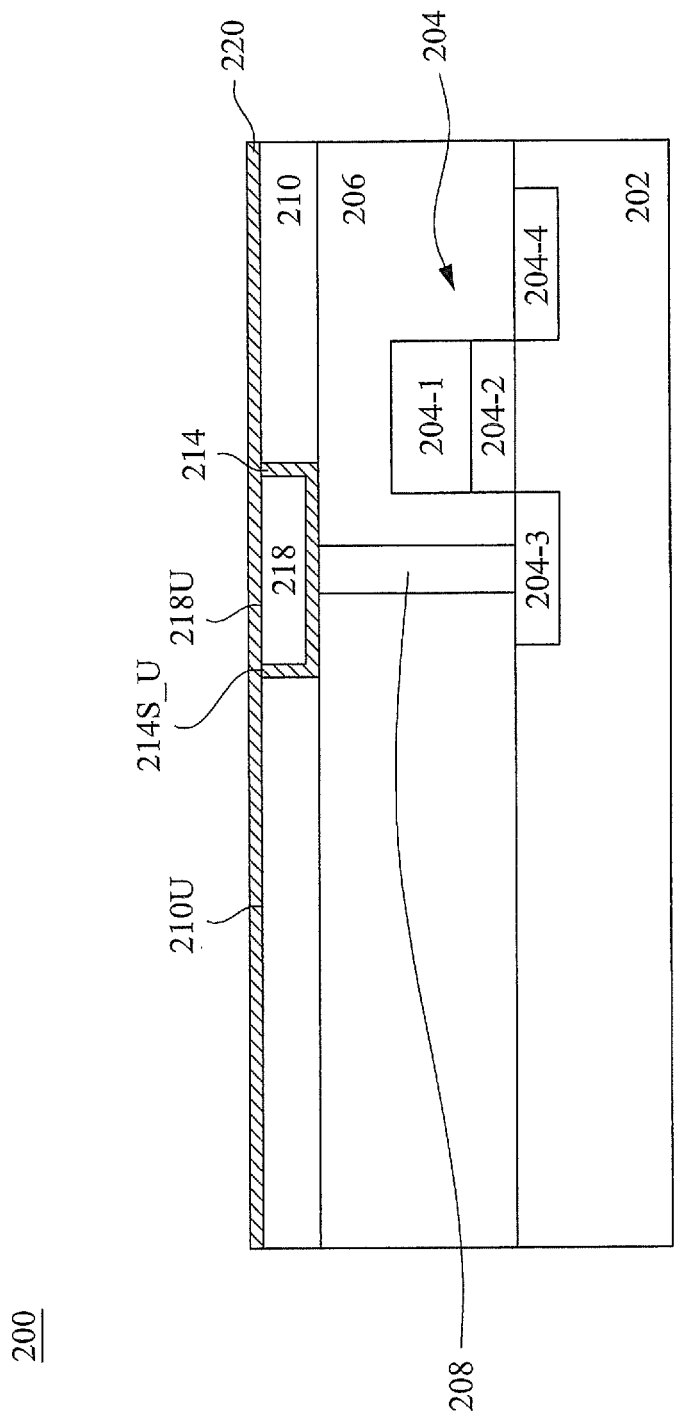

Corresponding to operation 114 of FIG. 1A, FIG. 2G is a cross-sectional view of the RRAM device 200 including a second barrier material 220, which is formed at one of the various stages of fabrication, according to some embodiments. As shown, the second barrier material 220 overlays the first dielectric layer 210 and lower contact feature 218. In particular, the second barrier material 220 is in connection with the upper boundaries 210U, 214S_U, and 218U. Further, in some embodiments, since the first and second barrier materials 214 and 220 are formed of a substantially similar material, the first and second barrier materials 214 and 220 may be formed as a one-piece layer. Similar to the first barrier material 214, the second barrier material 220 is substantially conformal and thin.

As mentioned above, the first and second barrier materials 214 and 220 are formed of the substantially similar material. Accordingly, in some embodiments, the second barrier material 220 may include a material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the second barrier material 220 is shown as a single layer in the illustrated embodiment of FIG. 2G (and the following figures), it is noted that the second barrier material 220 may include plural layers formed as a stack, wherein each of the plural layers is formed of one of the above-described materials, e.g., TaN, Ta, Ta+TaN, etc. In some embodiments, the second barrier material 220 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the first dielectric layer 210 and the lower contact feature 218.

Figure 2H:
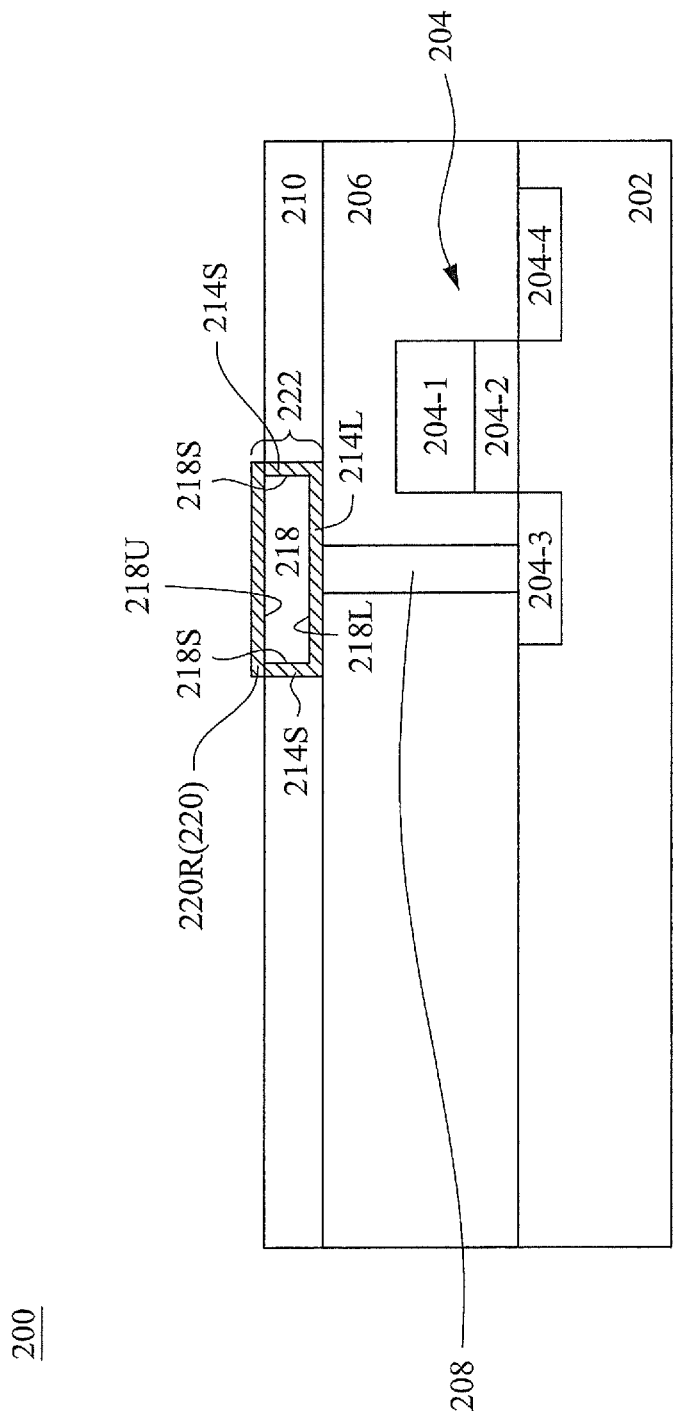

Corresponding to operation 116 of FIG. 1A, FIG. 2H is a cross-sectional view of the RRAM device 200 including a barrier layer 222, which is formed at one of the various stages of fabrication, according to some embodiments. In accordance with some embodiments, the barrier layer 222 is formed of the sidewall portions 214S and lower portion 214L of the first barrier material 214, and a remaining portion 220R of the second barrier material 220. As shown in the illustrated embodiment of FIG. 2H (and the following figures), the lower contact feature 218 is fully surrounded by the barrier layer 222 (i.e., the sidewall portions 214S and lower portion 214L of the first barrier material 214, and the remaining portion 220R of the second barrier material 220). More specifically, the remaining portion 220R of the second barrier material 220 extends along the upper boundary 218U of the lower contact feature 218; the sidewall portions 214S of the of the first barrier material 214 respectively extend along the sidewalls 218S of the lower contact feature 218; and the lower portion 214L extends along the lower boundary 218L of the lower contact feature 218.

In some embodiments, the remaining portion 220R of the second barrier material 220 may be formed by at least some of the following process steps: forming a patterned layer (e.g., a hard mask layer), which is not shown, over the second barrier material 220 (FIG. 2G) to cover an area where the remaining portion 220R is to be formed; performing one or more wet/dry etching processes on the second barrier material 220 while using the patterned layers as a mask; and performing at least one cleaning process. Since the second barrier material 220 is substantially conformal and thin, as mentioned above, the remaining portion 220R may also be formed as a thin film. In some embodiments, the above-mentioned area of the second barrier material 220, covered by the patterned layer, is aligned with vertical projections of the sidewall portions 214S at two respective ends, which will be discussed as follows.

Although in the illustrated embodiment of FIG. 2H (and the following figures), a vertical projection of the sidewall portion 214S of the first barrier material 214 is aligned with one of the ends of the remaining portion 220R of the second barrier material 220, it is noted that in some other embodiments (not shown), at least one of the ends of the remaining portion 220R of the second barrier material 220 may extend beyond the corresponding vertical projection of the sidewall portion 214S of the first barrier material 214 while remaining within the scope of the present disclosure. Alternatively stated, the remaining portion 220R of the second barrier material 220 may have a width greater than a width of the lower contact feature 218 plus respective widths of the sidewalls portions 214S of the first barrier material 214.

Figure 2I:
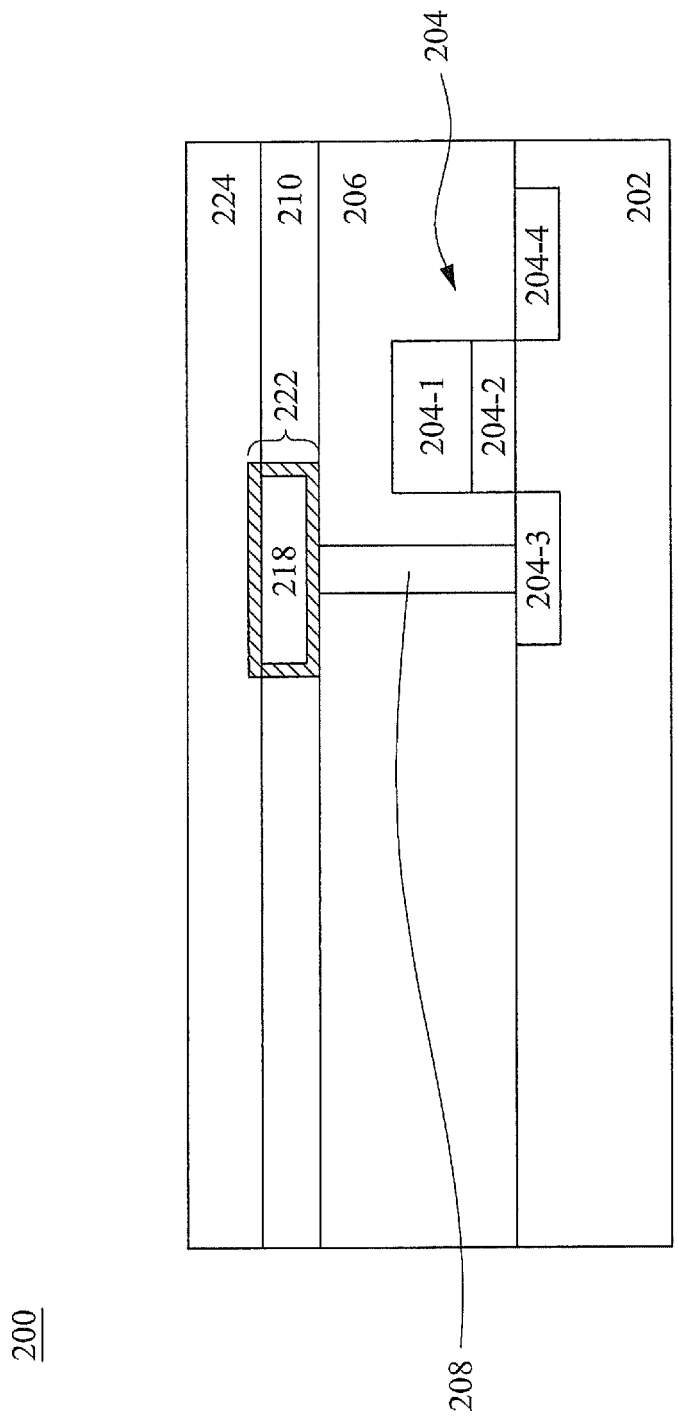

Corresponding to operation 118 of FIG. 1B, FIG. 2I is a cross-sectional view of the RRAM device 200 including a dielectric mask layer 224, which is formed at one of the various stages of fabrication, according to some embodiments. As shown, the dielectric mask layer 224 overlays the first dielectric layer 210, and the lower contact feature 218 with part of the barrier layer 222 coupled therebetween. In some embodiments, the dielectric mask layer 224 may include a dielectric material selected from a group consisting of: oxide, silicon rich oxide, silicon carbide (SiC), silicon nitride (SiN), etc. In some embodiments, the dielectric mask layer 224 is fainted by is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described dielectric material over the first dielectric layer 210.

Figure 2J:
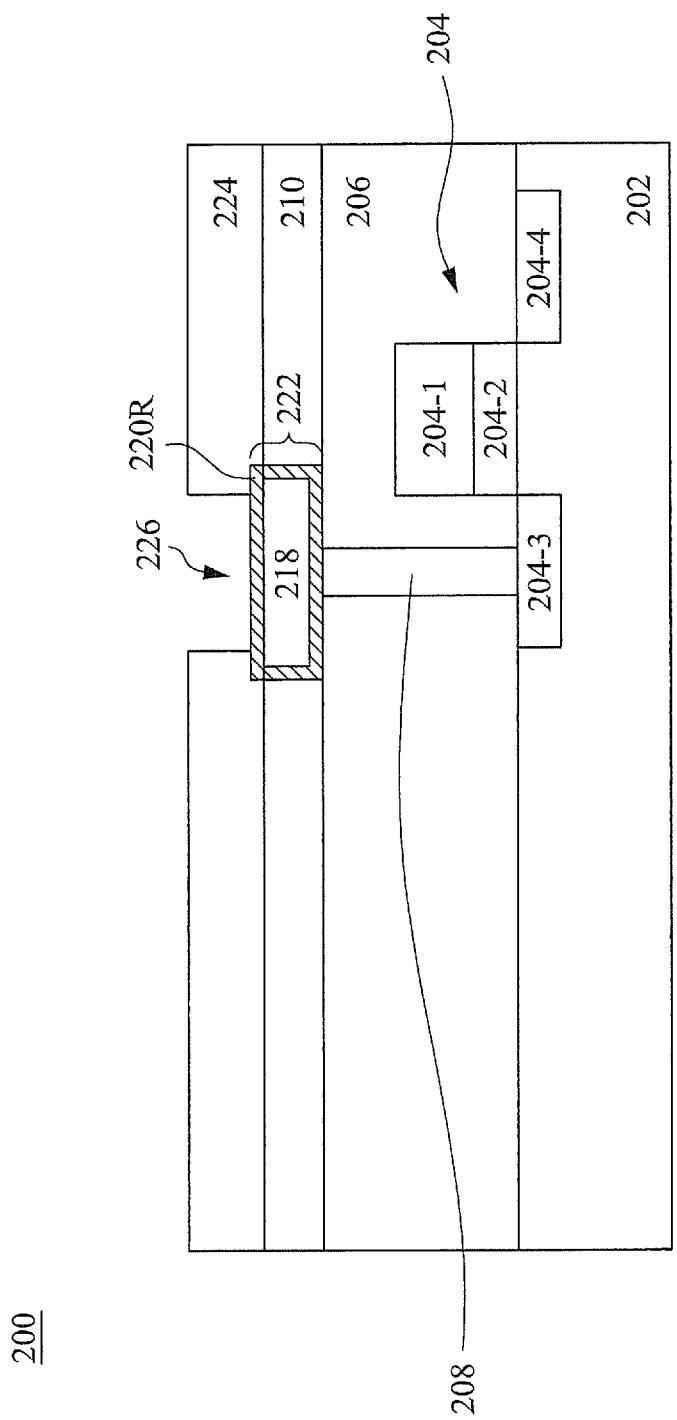

Corresponding to operation 120 of FIG. 1B, FIG. 2J is a cross-sectional view of the RRAM device 200 including a recessed region 226, which is formed at one of the various stages of fabrication, according to some embodiments. As shown, the recessed region 226 is formed to extend through the dielectric mask layer 224 in order to expose at least a portion of an upper boundary of the barrier layer 222, or more specifically, the remaining portion 220R of the second barrier material 220.

In some embodiments, the recessed region 226 may be formed by at least some of the following process steps: forming a patterned layer (e.g., a hard mask layer), which is not shown, over the dielectric mask layer 224 (FIG. 2I) to cover an area where the recessed region 226 is not to be formed; performing one or more wet/dry etching processes on the dielectric mask layer 224 while using the patterned layers as a mask; and performing at least one cleaning process. It is noted that in some embodiments, an etch stop layer, which is configured to buffer at least some of the one or more wet/dry etching processes while forming the recessed region 226, may be formed between the barrier layer 222 and dielectric mask layer 224.

Figure 2K:
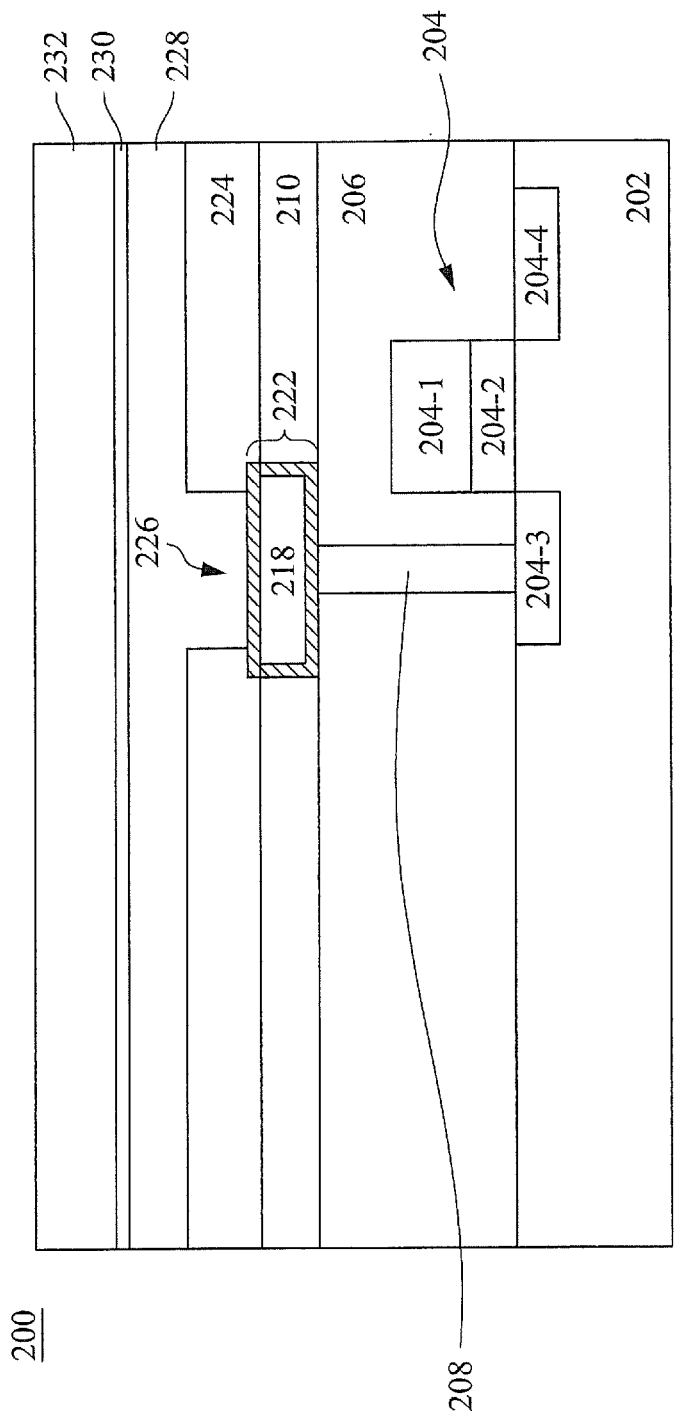

As discussed above, when making the existing RRAM devices, loss of conductive materials at corner(s) of the lower contact feature is typically present, which disadvantageously impacts the performance of the RRSM devices. In stark contrast, the lower contact feature 218 of the disclosed RRAM device 200 is fully surrounded by the barrier layer 222. Such a barrier layer 222 may be configured to protect the lower contact feature 218 from any of a variety of damage, in accordance with some embodiments. Further, even though a misalignment occurs when forming the recessed region 226, the lower contact feature 218 can still be protected by the barrier layer 222, Corresponding to operation 122 of FIG. 1B, FIG. 2K is a cross-sectional view of the RRAM device 200 including a first capping material 228, a variable resistive material 230, and a second capping material 232, which are formed at one of the various stages of fabrication, according to some embodiments. In the illustrated embodiment of FIG. 2K, the first capping material 228 overlays the dielectric mask layer 224 to refill the recessed region 226 thereby producing a substantially planar upper boundary, and the variable resistive material 230 and second capping material 232 are respectively formed over such a substantially planar upper boundary to each produce a substantially planar upper boundary. However, in some other embodiments (not shown), the first capping material 228 may not fully refill the second trench region 226, which in turn causes the corresponding upper boundary to follow the profile of the recessed region 226 (i.e., not a substantially planar upper boundary).

In some embodiments, the first capping material 228 may include a material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the first capping material 228 is shown as a single layer in the illustrated embodiment of FIG. 2K (and the following figures), it is noted that the first capping material 228 may include plural layers formed as a stack, wherein each of the plural layers is formed of one of the above-described materials, e.g., TaN, TiN, etc. In some embodiments, the first capping material 228 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the dielectric mask layer 224.

In some embodiments, the variable resistive material 230 has a resistance conversion characteristic (e.g. variable resistance). In other words, the variable resistive material 230 includes material characterized to show reversible resistance variance in accordance with a polarity and/or an amplitude of an applied electrical pulse. The variable resistive material 230 includes a dielectric layer. The variable resistive material 230 may be changed into a conductor or an insulator based on polarity and/or magnitude of electrical signal.

In one embodiment, the variable resistive 230 may include a transition metal oxide. The transition metal oxide maybe denoted as $M_xO_y$, where M is a transition metal, O is oxygen, x is the transition metal composition, and y is the oxygen composition. In an embodiment, the variable resistive material 230 includes $ZrO_2$. Examples of other materials suitable for the variable resistive material 230 include: NiO, $TiO_2$, HfO, ZrO, ZnO, $WO_3$, CoO, $Nb_2O_5$, $Fe_2O_3$, CuO, $CrO_2$, $SrZrO_3$ (Nb-doped), and/or other materials known in the art. In another embodiment, the variable resistive 230 may include a colossal magnetoresistance (CMR)-based material such as, for example, $Pr_{0.7}Ca_{0.3}$, $MnO_3$, etc.

In yet another embodiment, the variable resistive 230 may include a polymer material such as, for example, polyvinylidene fluoride and poly[(vinylidenefluoride-co-trifluoroethylene] (P(VDF/TrFE)). In yet another embodiment, the variable resistive 230 may include a conductive-bridging random access memory (CBRAM) material such as, for example, Ag in GeSe. According to some embodiments, the variable resistive material 230 may include multiple layers having characteristics of a resistance conversion material. A set voltage and/or a reset voltage of the variable resistive material 230 may be determined by the variable resistive material 230's compositions (including the values of "x" and "y"), thickness, and/or other factors known in the art.

In some embodiments, the variable resistive material 230 may be formed by an atomic layer deposition (ALD) technique with a precursor containing a metal and oxygen. In some embodiments, other chemical vapor deposition (CVD) techniques may be used. In some embodiments, the variable resistive material 230 may be formed by a physical vapor deposition (PVD) technique, such as a sputtering process with a metallic target and with a gas supply of oxygen and optionally nitrogen to the PVD chamber. In some embodiments, the variable resistive material 230 may be formed by an electron-beam deposition technique.

In some embodiments, the second capping material 232 may include a substantially similar material of the first capping material 228. Thus, the second capping material 232 may include a material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the second capping material 232 is shown as a single layer in the illustrated embodiment of FIG. 2K (and the following figures), it is noted that the second capping material 232 may include plural layers formed as a stack, wherein each of the plural layers is formed of one of the above-described materials, e.g., TaN, TiN, etc. In some embodiments, the second capping material 232 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the variable resistive material 230.

Figure 2L:
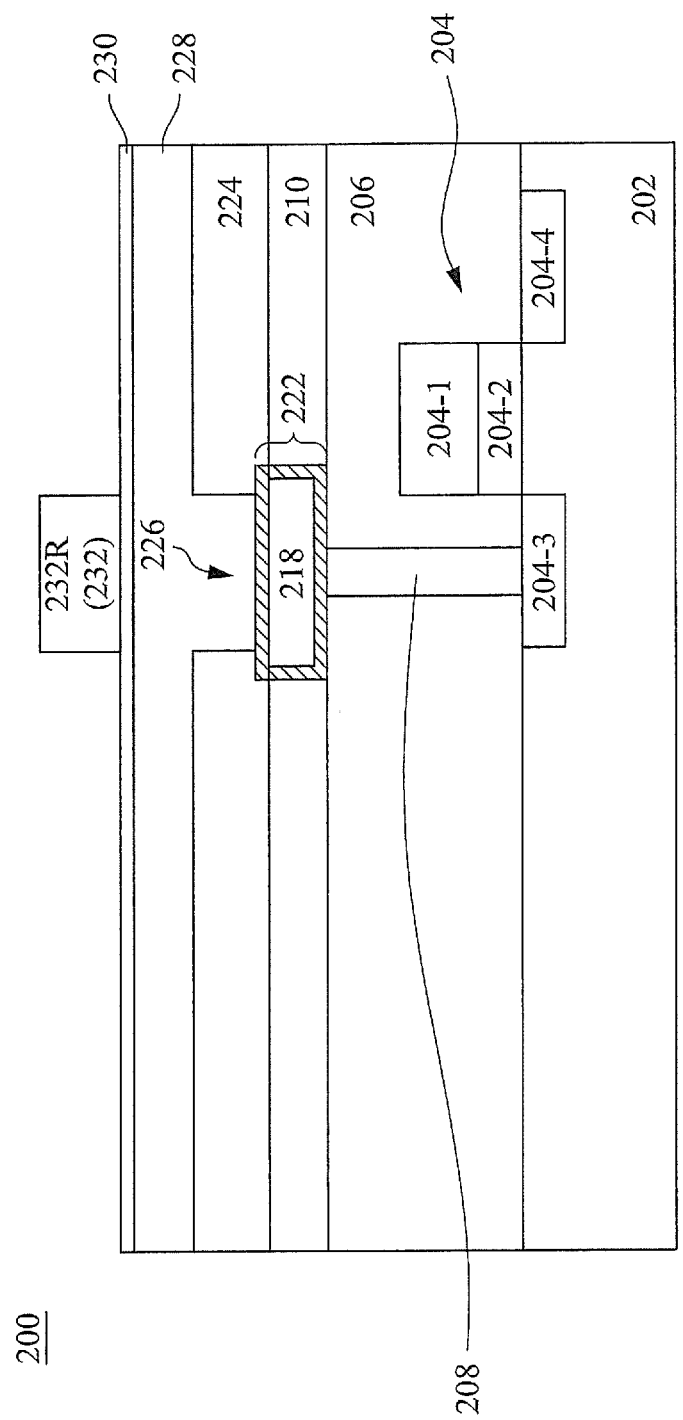

Corresponding to operation 124 of FIG. 1B, FIG. 2L is a cross-sectional view of the RRAM device 200 in which the second capping material 232 is patterned at one of the various stages of fabrication, according to some embodiments. As shown, the second capping material 232 is patterned to leave a remaining portion 232R, which is herein referred to as an "upper capping layer 232R." In accordance with some embodiments, the upper capping layer 232R is vertically aligned with the lower contact feature 218.

In some embodiments, the upper capping layer 232R may be formed by at least some of the following process steps: forming a patterned layer (e.g., a hard mask layer), which is not shown, over the second capping material 232 (FIG. 2K) to cover an area where the upper capping layer 232R is to be formed; performing one or more wet/dry etching processes on the second capping material 232 while using the patterned layers as a mask; and performing at least one cleaning process. After the formation of the upper capping layer 232R, a pair of spacers may be formed at respective sides of the upper capping layer 212R, which will be discussed below.

Figure 2M:
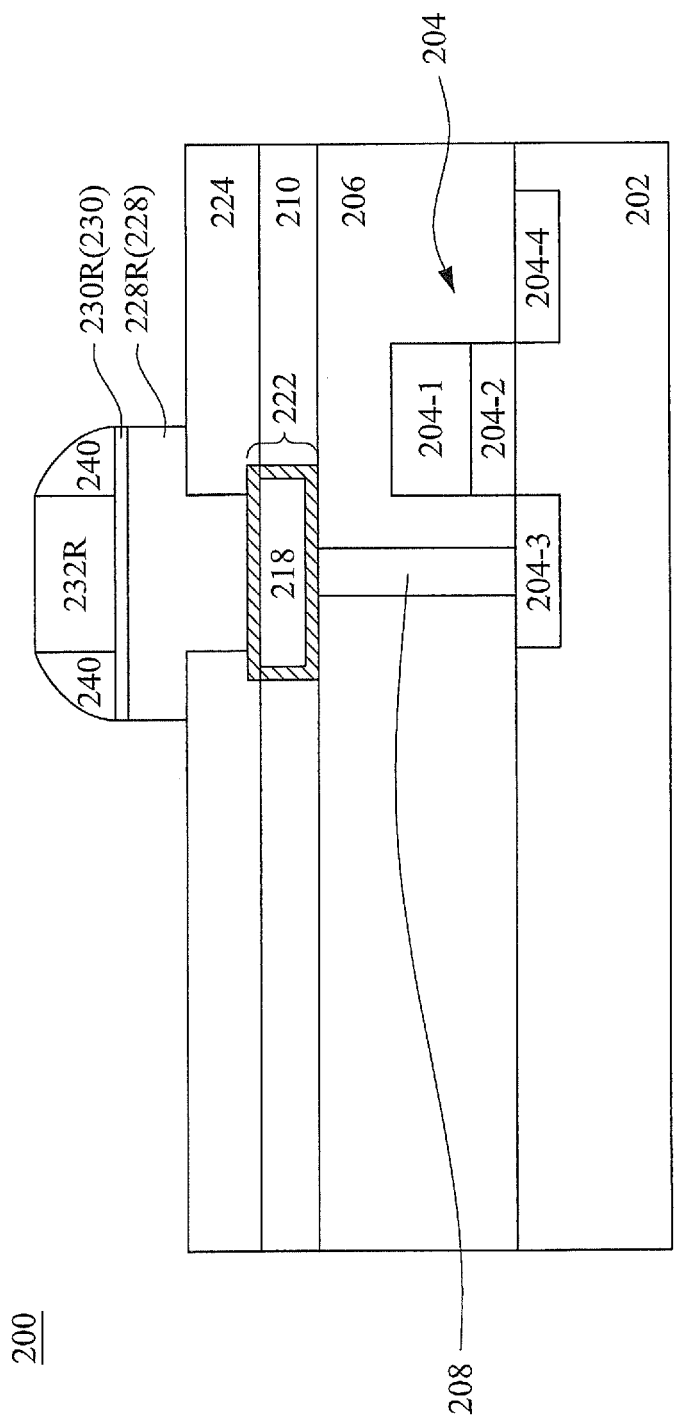

Corresponding to operation 126 of FIG. 1B, FIG. 2M is a cross-sectional view of the RRAM device 200 in which the variable resistive material 230 and first capping material 228 are patterned at one of the various stages of fabrication, according to some embodiments. As shown, the variable resistive material 230 and first capping material 228 are, respectively or collectively, patterned to leave remaining portions 230R and 228R, which are herein referred to as "variable resistive material layer 230R" and "lower capping layer 228R." In accordance with some embodiments, the variable resistive material layer 230R and the portion of the lower capping layer 228R above the upper boundary of the dielectric mask layer 224 may share a same width that is wider than a width of the upper capping layer 232R.

In some embodiments, the variable resistive material layer 230R and lower capping layer 228R may be, respectively or concurrently, formed by at least some of the following process steps: forming spacers 240 at respective sides of the upper capping layer 232R and over the variable resistive material 230 (FIG. 2L); respectively or concurrently performing one or more wet/dry etching processes on the variable resistive material 230 and first capping material 228 while using the spacers as a mask; and performing at least one cleaning process. In some embodiments, the spacers 240 may be formed of a material selected from a group consisting of: oxide, silicon rich oxide, silicon carbide (SiC), silicon nitride (SiN), etc.

Figure 2N:
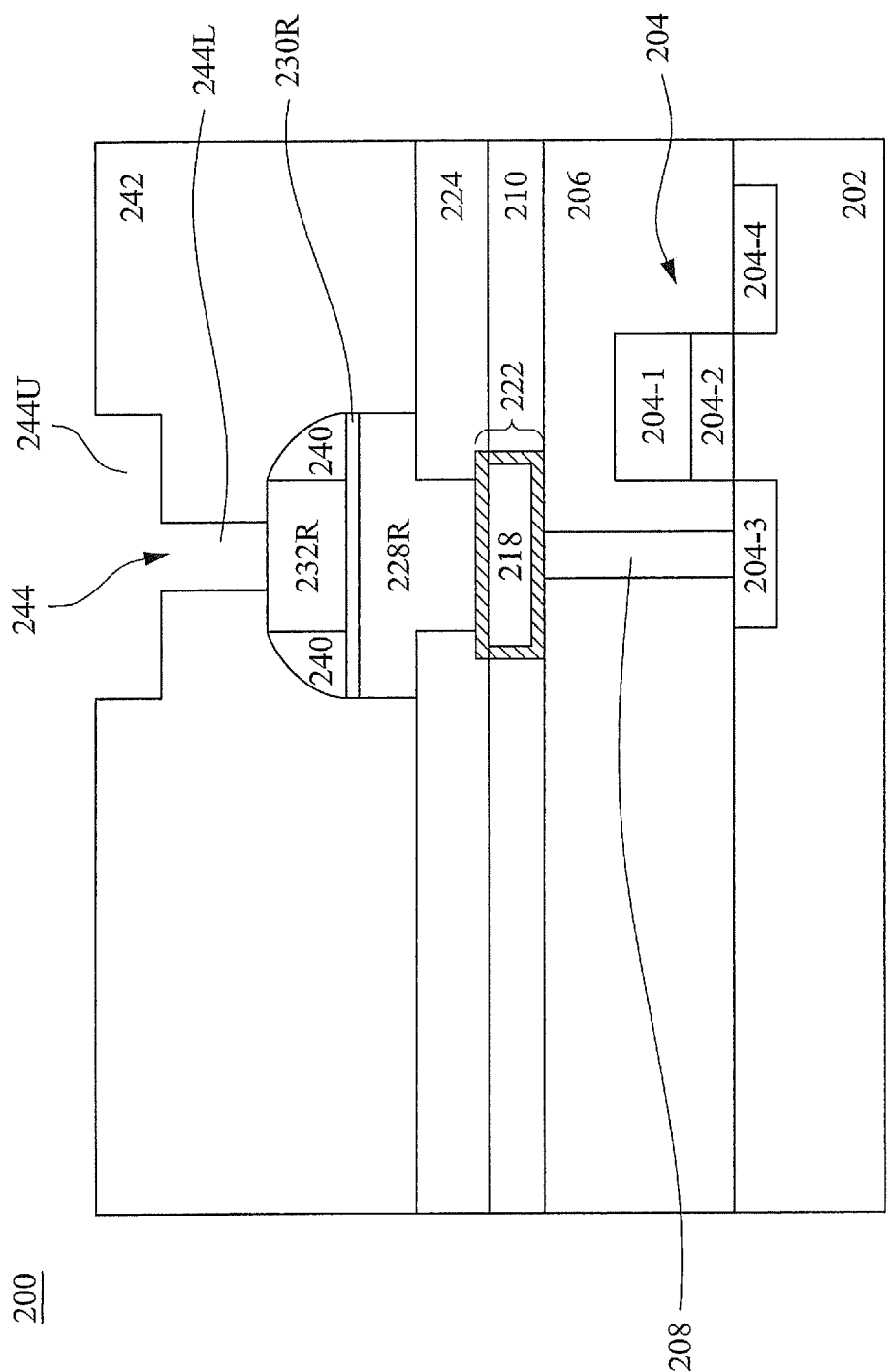
Figure 2O:
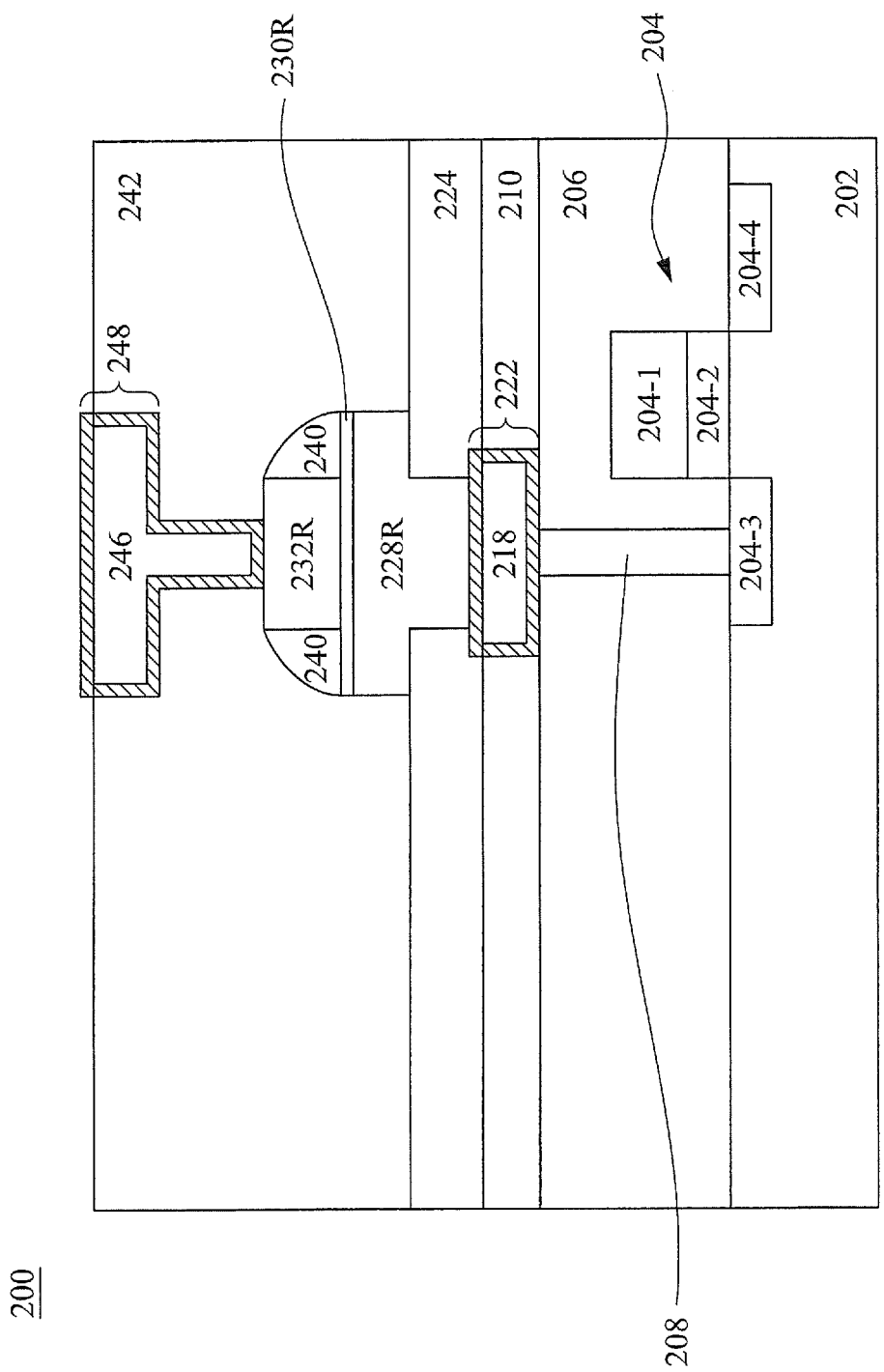

Corresponding to operation 128 of FIG. 1B, FIG. 2N is a cross-sectional view of the RRAM device 200 including a second dielectric layer 242 with a recessed region 244 extending therethrough, which is formed at one of the various stages of fabrication, according to some embodiments. As shown, the recessed region 244 is formed to expose at least a portion of an upper boundary of the upper capping layer 232R, and further the recessed region 244 has a lower via-hole region 244L and an upper trench region 244U.

In some embodiments, the third dielectric layer 242 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzo-cyclobutenes), SiLK (Dow Chemical, Midland, Mich.), polyimide, and/or other future developed low-k dielectric materials.

It is noted that the recessed region 244 is an exemplary dual damascene opening that is patterned in the third dielectric layer 242 (and an etch stop layer, which is not shown) to define a contact region over the upper capping layer 232R. Although the embodiment of FIG. 2N illustrates a dual damascene opening in the third dielectric layer 242, the use of a single damascene opening in the third dielectric layer 242 may also be used. In dual damascene techniques including a "via-first" patterning method or a "trench-first" patterning method, the upper trench region 244U and the lower via-hole region 244L may be formed using a typical lithographic with masking technologies and anisotropic etch operation (e.g. plasma etching or reactive ion etching). In alternative embodiments, a bottom etch stop layer (not shown), a middle etch stop layer (not shown), a polish stop layer (not shown), or an anti-reflective coating (ARC) layer (not shown) is deposited on or intermediately in the third dielectric layer 242, providing a clear indicator of when to end a particular etching process.

Corresponding to operation 130 of FIG. 1B, FIG. 2O is a cross-sectional view of the RRAM device 200 including an upper contact feature 246, which is formed at one of the various stages of fabrication, according to some embodiments. As shown, the upper contact feature 246 is formed in the recessed region 244 (FIG. 2N) so as to couple the upper capping layer 232R.

In some embodiments, the upper contact feature 246 includes a conductive material such as, for example, copper (Cu), aluminum (Al), tungsten (W), etc. The upper contact feature 246 may be formed by using CVD, PVD, E-gun, and/or other suitable techniques to deposit the above-described conductive material over the third dielectric layer 242; and performing one or more polishing processes to remove excessive conductive material. In some embodiments, similar to the lower contact feature 218, the upper contact feature 246 may also be fully surrounded by a respective barrier layer 248 that is substantially similar to the barrier layer 222. Thus, discussions of making the barrier layer 248 surrounding the upper contact feature 246 are not repeated here.

In some embodiments, the lower contact feature 218, the lower capping layer 228R, the variable resistive material layer 230R, the upper capping layer 232R, and the upper contact feature 246 may form an RRAM resistor, in which at least part of lower capping layer 228R and at least part of the upper capping layer 232R are referred to as a bottom or lower electrode and a top or upper electrode of the RRAM resistor, respectively. In some embodiments, such an RRAM resistor is coupled to the transistor 204 through the contact plug 208 so as to form a 1-transistor-1-resistor (1T1R) RRAM bit cell, wherein the RRAM resistor functions as the data storage component and the transistor 204 functions as the access transistor of the 1T1R RRAM bit cell.

In an embodiment, a memory cell includes: a first contact feature; a resistive material layer disposed above the first contact feature; and a second contact feature disposed above the resistive material layer, wherein at least one of the first and second contact features is fully surrounded by a barrier layer.

In another embodiment, a memory cell includes: a first contact feature partially embedded in a first dielectric layer; a barrier layer, lining the first contact feature, that comprises a first portion disposed between the first contact feature and first dielectric layer, and a second portion disposed above the first dielectric layer; a resistive material layer disposed above the first contact feature, the resistive material layer coupled to the first contact feature through the second portion of the barrier layer; and a second contact feature embedded in a second dielectric layer above the first dielectric layer.

Yet in another embodiment, a method includes: forming a trench over a dielectric layer; forming a first contact feature in the trench, wherein the first contact feature is fully surrounded by a barrier layer; forming a resistive material layer over the first contact feature; and fof ning a second contact feature over the resistive material layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a memory cell, comprising:
  forming a first contact feature in a first dielectric layer;
  forming a first barrier layer that surrounds and contacts top, bottom and side surfaces of the first contact feature;
  forming a resistive material layer over the first contact feature;
  forming a second contact feature over the resistive material layer; and
  forming a second barrier layer that surrounds and contacts top, bottom and side surfaces of the second contact feature.

2. The method of claim 1, wherein the first barrier layer comprises a first portion disposed in the first dielectric layer and extending along a lower boundary and sidewalls of the first contact feature, and a second portion disposed above the first dielectric layer and extending along an upper boundary of the first contact feature.

3. The method of claim 1, further comprising:
  providing a substrate;
  forming source/drain features of a transistor in the substrate; and
  forming a gate of the transistor formed in the first dielectric layer, wherein the first dielectric layer is formed over the substrate.

4. The method of claim 3, further comprising a forming contact plug extending from a top surface of the first dielectric layer to a top surface of the substrate, wherein the contact plug is coupled to at least one of the source/drain features.

5. The method of claim 4, wherein the contact plug is disposed directly below the first contact feature and the resistive material layer, and electrically coupling the first contact feature to the source/drain feature.

6. The method of claim 1, further comprising forming a first capping material layer over the first contact feature, wherein the resistive material layer is formed over the first capping material layer.

7. The method of claim 6, further comprising forming a second capping material layer formed over the resistive material layer.

8. The method of claim 7, wherein the resistive material layer comprises a variable resistive material.

9. A method of making a memory cell comprising:
  providing a substrate;
  forming a source/drain feature of a transistor in the substrate;
  forming a first dielectric layer over the substrate;
  forming a gate of the transistor in the first dielectric layer;
  forming a second dielectric layer over the first dielectric layer;
  forming a first contact feature in the second dielectric layer;
  forming a first barrier layer that surrounds and contacts top, bottom and side surfaces of the first contact feature;
  forming a resistive material layer above the first contact feature;
  forming a second contact feature above the resistive material layer;
  forming a second barrier layer that surrounds and contacts top, bottom and side surfaces of the second contact feature; and
  forming a conductive plug within the first dielectric layer, wherein the conductive plug electrically couples the first contact feature to the source/drain feature.

10. The method of claim 9, wherein the resistive material layer presents a variable resistance value.

11. The method of claim 9, wherein at least one of the first and second contact features is partially embedded in a low-k dielectric layer.

12. The method of claim 11, wherein the first barrier layer comprises a first portion disposed between the low-k dielectric layer and the first contact feature.

13. The method of claim 12, wherein the first portion of the first barrier layer extends along a top boundary, a lower boundary and sidewalls of the first contact feature.

14. The method of claim 11, wherein the first barrier layer comprises a second portion disposed above the low-k dielectric layer.

15. The method of claim 14, wherein the second portion of the first barrier layer is formed as a thin film that fully overlays an upper boundary of the first contact feature.

16. A method of making a memory cell comprising:
   providing a substrate;
   forming a source/drain feature of a transistor in the substrate;
   forming a first dielectric layer over the substrate;
   forming a first contact feature at least partially embedded in the first dielectric layer;
   forming a first barrier layer that surrounds and contacts top, bottom and side surfaces of the first contact feature, the first barrier layer comprising a first portion disposed between the first contact feature and the first dielectric layer, and a second portion disposed above the first dielectric layer;
   forming a resistive material layer above the first contact feature, the resistive material layer coupled to the first contact feature through the second portion of the barrier layer;
   forming a second contact feature embedded in a second dielectric layer above the first dielectric layer;
   forming a second barrier layer that surrounds and contacts top, bottom and side surfaces of the second contact feature; and
   forming a conductive plug in the first dielectric layer, the conductive plug electrically coupling the first contact feature to the source/drain feature.

17. The method of claim 16, wherein the resistive material layer presents a variable resistance value.

18. The method of claim 16, wherein the first and second dielectric layers are each formed of a low-k dielectric material.

19. The method of claim 16, wherein the first portion of the first barrier layer extends along a lower boundary and sidewalls of the first contact feature.

20. The method of claim 16, the second portion of the first barrier layer fully overlays an upper boundary of the first contact feature.

* * * * *